United States Patent
Tomko et al.

(10) Patent No.: US 10,773,456 B2
(45) Date of Patent: Sep. 15, 2020

(54) PROCESS FOR STRENGTHENING POROUS 3D PRINTED OBJECTS

(71) Applicant: Freshmade 3D, LLC, Youngstown, OH (US)

(72) Inventors: Christopher Tomko, Butler, PA (US); Brett Conner, Poland, OH (US)

(73) Assignee: Freshmade 3D, LLC, Youngstown, OH (US)

(*) Notice: Subject to any disclaimer, the term of this patent is extended or adjusted under 35 U.S.C. 154(b) by 248 days.

(21) Appl. No.: 15/707,598

(22) Filed: Sep. 18, 2017

(65) Prior Publication Data

US 2018/0079134 A1    Mar. 22, 2018

Related U.S. Application Data

(60) Provisional application No. 62/398,271, filed on Sep. 22, 2016.

(51) Int. Cl.

| | |
|---|---|
| *B29C 64/165* | (2017.01) |
| *B33Y 99/00* | (2015.01) |
| *B29C 67/24* | (2006.01) |
| *B33Y 10/00* | (2015.01) |
| *B29C 64/112* | (2017.01) |
| *B29C 64/106* | (2017.01) |

(Continued)

(52) U.S. Cl.
CPC .......... *B29C 64/165* (2017.08); *B29C 67/242* (2013.01); *B33Y 10/00* (2014.12); *B33Y 99/00* (2014.12); *B28B 1/001* (2013.01); *B29C 64/106* (2017.08); *B29C 64/112* (2017.08); *C04B 2111/00181* (2013.01); *H05K 3/102* (2013.01)

(58) Field of Classification Search
None
See application file for complete search history.

(56) References Cited

U.S. PATENT DOCUMENTS 5,204,055 A * 4/1993 Sachs ............... B05C 19/04
419/2
5,387,380 A    2/1995 Cima et al.
(Continued)

FOREIGN PATENT DOCUMENTS

| DE | 102014011236 A1 | 2/2016 |
|---|---|---|
| EP | 1429911 A2 | 6/2004 |

(Continued)

OTHER PUBLICATIONS

Mashable, Huge 3D Printer Makes Buildings Out of Sand, Apr. 20, 2010, 10 pages, (http://mashable.com/2010/04/20/d-shape-sand-printer/#fc44UxDNakq3).

(Continued)

*Primary Examiner* — Chinessa T. Golden
(74) *Attorney, Agent, or Firm* — Lerner, David, Littenberg, Krumholz & Mentlik, LLP

(57) ABSTRACT

A composite body includes a bound mixture and a resin. The bound mixture includes a binder and a plurality of particles. The resin fully infiltrates the bound mixture such that the resin fully infiltrates an entire thickness of the composite body. The composite body is formed by combining a plurality of particles with a binder to form a bound mixture and infiltrating the bound mixture with a resin to a depth such that substantially an entire thickness of the composite body contains the resin.

22 Claims, 13 Drawing Sheets

(51) Int. Cl.
  *B28B 1/00* (2006.01)
  *C04B 111/00* (2006.01)
  *H05K 3/10* (2006.01)

(56) References Cited

U.S. PATENT DOCUMENTS

| | | | |
|---|---|---|---|
| 5,616,294 | A | 4/1997 | Deckard |
| 7,332,537 | B2 | 2/2008 | Bredt et al. |
| 7,531,117 | B2 | 5/2009 | Ederer et al. |
| 7,569,273 | B2 | 8/2009 | Bredt et al. |
| 8,137,607 | B2 | 3/2012 | Kloeb et al. |
| 9,388,078 | B2 | 7/2016 | Rael |
| 2005/0059757 | A1* | 3/2005 | Bredt ............ B33Y 10/00 524/3 |
| 2007/0045891 | A1 | 3/2007 | Martinoni et al. |
| 2016/0303762 | A1 | 10/2016 | Gunther |
| 2017/0210037 | A1 | 7/2017 | Ederer et al. |

FOREIGN PATENT DOCUMENTS

| | | | | |
|---|---|---|---|---|
| WO | 2002018120 | A2 | 3/2002 | |
| WO | 03026876 | A2 | 4/2003 | |
| WO | 2015108544 | A1 | 7/2015 | |
| WO | 2016068899 | A1 | 5/2016 | |
| WO | WO-2016068899 | A1 * | 5/2016 | ............ B33Y 30/00 |

OTHER PUBLICATIONS

Casting Emission Reduction Program, Mold Making Emissions From the Prometal S15 Digital Printing Machine, Technikon, Apr. 2008, 56 pages, No. 1412-124 HRa.

3ders.org, Architect, Voxeljet Create Ultra High-Performance Concrete Using 3D Printing, 3D Printer and 3D Printing News, Feb. 26, 2014, 11 pages, (http://www.3ders.org/articles/20140226-architect-voxeljet-create-ultra-high-performance-concrete-using-3d-printing.html).

3D Printing With Sand Using the Power of the Sun, TechCrunch Sep. 25, 2014, 5 pages (<https://techcrunch.com/2014/09/25/3d-printing-with-sand-using-the-power-of-the-sun/>).

Sharing Reviews about Laptops, Notebooks, PC and Accessories: 3D Printing and Infiltration Methods, Sep. 1, 2012, 2 pages, (http://sharingreviewslaptop.blogspot.com/2012/09/3d-printing-and-infiltration-methods.html).

Almaghariz, E.S., Determining When to Use 3D Sand Printing: Quantifying the Role of Complexity, Thesis, May 2015, 81 pages, Youngstown State University.

Statasys, FDM Best Practice: Solvent Smoothing, Nov. 2014, 6 pages (<http://www.advancedtek.com/wp-content/uploads/2016/08/Best_Practice_-_FDM_Solvent_Smoothing_-_11-14.pdf>).

3DP Consumables Catalog, Z Corporation, Oct. 2008, 16 pages, (http://sldtech.com/wp-content/uploads/2008/10/consumables_catalog.pdf).

Grilli, D., Extremely Economical Production of Punctional Plastic Parts with AE12 Binder Jetting, Mould & Die World, Jan. 11, 2017, 2 pages (http://www.mouldanddieworld.com/extremely-economical-production-functional-plastic-parts-ae12-binder-jetting/).

Swengley, N., Week Three: Museums and the 3D Design Market, DeTnk., Aug. 25, 2017, 4 pages <http://www.detnk.com/node/10614>.

Admin, Industrial grade 3D printed concrete, 3dprinter.in, Mar. 1, 2014, 2 pages (http://www.3dprinter.in/industrial-grade-3d-printed-concrete/).

Cheap Pandora Bracelets Wholesale, Infiltration in 3D Printing, Feb. 13, 2013, 2 pages, (http://blogs.dadi360.com/wholesalecheapbracelets/2013/02/13/infiltration-in-3d-printing/).

Joris, Interview with Viridis3D President Will Shambley, 3D Printing Blog, Apr. 29, 2011, 13 pages, i.materialize (https://i.materialise.com/blog/interview-with-viridis3d-president-will-shambley/).

Teiser, et al., Large Scale 3D Printing of Complex Geometric Shapes in Construction, 33rd International Symposium on Automation and Robotics in Construction, Jul. 2016, 8 pages (http://www.iaarc.org/publications/fulltext/ISARC2016-Paper186.pdf).

METEC Product Datasheet, Rapid and efficient sand casting of molds; InOrganic-Binding (IOB) sand molds; Plastic parts for investment, Voxeljet AG, Jan. 16, 2015, 5 pages (http://www.metec-tradefair.com/cipp/md_gmtn/custom/pub/show,lang,2/oid,23700/xa_nr,2395494/~/Web-ProdDatasheet/prod_).

Voxeljet, Sand Casting Molds—Rapid and Economical , at least as of Jul. 2017, 4 pages, (http://www.voxeljet.de/en/materials/sand/).

Molitch, M., Sand Made to Launch Low-Cost SLS 3D Printer at TEDX Krakow, 3D Printing Industry, May 8, 2015, 8 pages (https://3dprintingindustry.com/news/sand-made-to-launch-low-cost-sls-3d-printer-at-tedx-krakow-48639/).

Traeger, C., 3D Printing as Source of Inspiration for Changes within the Foundry Industry, AFI Conference 2016, Oct. 2016, 23 pages (http://www.afivictoria.org.au/wp-content/uploads/2016/11/Traegger_Presentation-AFI-Conference-2016.pdf).

Zcorp Z310+ Powder Bed Printer Product Sheet, Evillabs.net, Oct. 27, 2016, 15 pages, (http://www.evillabs.net/index.php/ZCorp_Z310%2B).

International Search Report for PCT/US2017/052719 dated Dec. 14, 2017.

Extended European Search Report with Written Opinion for Application No. 17853891.4 dated May 19, 2020, 10 pages.

* cited by examiner

PROCESS FOR STRENGTHENING POROUS 3D PRINTED OBJECTS

CROSS-REFERENCE TO RELATED APPLICATION

The present application claims the benefit of the filing date of U.S. Provisional Patent Application No. 62/398,271 filed Sep. 22, 2016, the disclosure of which is hereby incorporated herein by reference.

FIELD OF THE TECHNOLOGY

The present technology relates generally to the preparation of articles formed of bound particulates, and in particular to the strengthening of such articles, especially with respect to such articles formed by three-dimensional ("3D") printing.

BACKGROUND OF THE TECHNOLOGY

Additive manufacturing technologies, such as 3D printing, have been employed to rapidly produce casting molds as well as end products with complex geometries, e.g., articles requiring undercuts. Binder jetting, a generally lower cost 3D printing process, involves extruding a liquid, or otherwise sufficiently flowable, polymer binder from a nozzle, onto a bed of a particle composition in a controlled manner using a traditional multiple array inkjet print head to form and fuse patterned layers into an article substantially corresponding to a prepared 3D computer model. Machines for 3D binder jet printing of particle compositions are manufactured by companies such as Voxeljet AG, The ExOne Company, LLC, and Zcorp, Inc.

Due to the relative low cost compared to other materials, silica sand has been used as a bound particulate in 3D printing by a growing number of industries to produce molds for final castings, especially for use in casting large metallic components which are prepared by pouring molten metal into a mold cavity formed by a sand casting. However, articles prepared by 3D sand printing have exhibited poor structural characteristics, such as lower flexural strengths, and thus the use of sand has been inadequate for preparing functional parts. Also, the production of large thin-walled sand parts has not been possible due to their high likelihood of breakage during handling.

Thus, improvements are needed to form either or both of stronger and larger thin-walled, low-cost 3D printed articles.

SUMMARY OF THE TECHNOLOGY

In accordance with an aspect of the technology, a plurality of particles, such as but not limited to sand or powdered materials described further herein, may be bound into a base body in the shape of a predetermined article. Such article may correspond or substantially correspond to a prepared 3D computer model. Either or both of the outside and inside surfaces of the base body may be infiltrated (i.e., impregnated) with a curable resin to form a composite body of increased strength, in particular increased flexural strength, relative to the base body alone. The depth of diffusion of the curable resin into the base body may vary based on a number of factors, in particular the amount of resin that is applied to the base body. The base body may be designed and may be subsequently formed such that excess particles may be removed from the base body after application of the resin. Additional coatings or back-fillings, such as but not limited to spray metallization, fiber strands, a fiber weave, metal plating, or dry powders may be added to the base body to give additional strength or a desired finish to the composite body.

In this manner, the printed part is imparted with a higher strength than previously sand-printed articles.

In accordance with another aspect of the technology, a composite body may include a bound mixture and a resin. The bound mixture may include a binder and a plurality of particles. The resin may fully infiltrate the bound mixture such that the resin fully infiltrates an entire thickness of the composite body.

In some arrangements, the bound mixture consists of the binder and the plurality of particles meaning the bound mixture only includes the binder and the plurality of particles.

In some arrangements, the bound mixture may define pores into which the resin is infiltrated.

In some arrangements, the composite body may further include a coating applied to the bound mixture. In some such arrangements, the coating may form an outer layer of the composite body. In some arrangements, the coating may be any one or any combination of a spray metallization, fiber strands, a fiber weave, metal plating, or dry powders. Coatings may be wholly or partially made of zinc, aluminum, copper, steel, nickel, titanium, silver, gold, tantalum, cobalt chromium, or alloys of these metals as well as cermets including tungsten carbide cobalt and ceramics including alumina and chromium carbide.

In some arrangements, such fiber strands and such fiber weave may be any one or any combination of fiberglass, carbon fiber, and an aramid fiber. In some arrangements, such fiber strands and such fiber weave may be embedded in the resin. In some arrangements, fiber strands may be any one or any combination of chopped, loose, and mat. Such spray metallization may be any one or any combination of an arc spraying, thermal or flame spraying, and kinetic or cold spraying.

In some arrangements, the coating may be metallic plating, such as but not limited to any one or any combination of copper, nickel, and chrome plating. Metallic plating may be performed using electroplating or electroless plating. In some examples of electroplating, electrically conductive dry powders may be added to the resin before the resin fully cures or a conductive coating may be applied onto the composite body. An electrically charged plating material, e.g., electrolytic copper, may then be applied to the conductive powders or other conductive coating that has been applied to the composite body.

In some arrangements, the dry powders may be metallic or ceramic particles.

In some arrangements, the binder may be one part of a two-part curable resin.

In some arrangements, the plurality of particles may be made of any one or any combination of a sand, sodium bicarbonate, polymer, plaster, metal, ceramic, ash, organic powders, e.g., corn cob powder, including edible powders, and other particles which preferably may have a large surface area or may be porous and preferably may be more flexible, e.g., relative to sand, including but not limited to engineered particles. In some arrangements, the plurality of particles may be solid. In some arrangements, the plurality of particles may be hollow.

In some arrangements, the composite body may be in the form of an at least partially hollow shell.

In some arrangements, the resin may have been applied from a plurality of directions to define a part line.

In some arrangements, the bound mixture may define a gradient porosity within the composite body.

In some arrangements, the porosity of an interior of the composite body may be greater than the porosity of an exterior of the composite body opposite the interior of the composite body.

In some arrangements, the composite body may be a first composite body fused to a second composite body, which may be in the same form as the first composite body, to define a combined construct. In some arrangements, the composite body may define a core, and a shell may at least partially surround the core to define a combined construct. In some such arrangements, the shell may be a carbon fiber shell.

In accordance with another aspect of the technology, a composite body may be formed by a process. In this process, a plurality of particles may be combined with a binder to form a bound mixture. The bound mixture may be infiltrated with a resin to a depth such that substantially an entire thickness of the composite body contains the resin. In some arrangements, all of the bound mixture of the composite body may be infiltrated with the resin.

In some arrangements, in combining the plurality of particles with the binder, the binder may be printed through a 3D printing head onto particles supported by a substrate. In some arrangements, unbound particles supported by the substrate may be separated from the composite body. In some arrangements, particles supported by the substrate may not adhere to each other.

In some arrangements, a portion or portions of the bound mixture may be removed such that substantially the entire thickness of the composite body contains the resin.

In some arrangements, in combining the plurality of particles with the binder, a bound mixture may be formed around unbound particles. In some arrangements, in combining the plurality of particles with the binder, a first section defined by unit cells may be formed extending from a second section. In some such arrangements, the second section may be substantially solid.

In some arrangements, the bound mixture infiltrated with the resin may be coated. In some such arrangements, the coating may form an outer layer of the composite body. In some arrangements, the coating may be any one or any combination of a spray metallization, fiber strands, a fiber weave, metal plating, or dry powders. Coatings may be wholly or partially made of zinc, aluminum, copper, steel, nickel, titanium, silver, gold, tantalum, cobalt chromium, or alloys of these metals as well as cermets including tungsten carbide cobalt and ceramics including alumina and chromium carbide.

In some arrangements, such fiber strands and such fiber weave may be any one or any combination of fiberglass, carbon fiber, and an aramid fiber. In some arrangements, such fiber strands and such fiber weave may be embedded in the resin. In some arrangements, fiber strands may be any one or any combination of chopped, loose, and mat. Such spray metallization may be any one or any combination of an arc spraying, thermal or flame spraying, and kinetic or cold spraying.

In some arrangements, the coating may be metallic plating, such as but not limited to any one or any combination of copper, nickel, and chrome plating. Metallic plating may be performed using electroplating or electroless plating. In some examples of electroplating, electrically conductive dry powders may be added to the resin before the resin fully cures or a conductive coating may be applied onto the composite body. An electrically charged plating material, e.g., electrolytic copper, may then be applied to the conductive powders or other conductive coating that has been applied to the composite body.

In some arrangements, the dry powders may be metallic or ceramic particles.

In some arrangements, the coating may surround the bound mixture infiltrated with the resin. In some such arrangements, unbound particles inside the coating may be removed.

In accordance with another aspect of the technology, a composite body may include a bound mixture that may include a binder and a first plurality of particles, a second plurality of particles, and a resin. The bound mixture may define a surface area. The second plurality of particles may be unbound by the binder. The resin may infiltrate the entire surface area of the bound mixture such that the resin-infiltrated surface area of the bound mixture may surround and may retain the second plurality of particles.

In some arrangements, the bound mixture consists of the binder and the first plurality of particles meaning the bound mixture only includes the binder and the first plurality of particles.

In accordance with another aspect of the technology, a composite body may include a bound mixture that may include a binder and a first plurality of particles, a second plurality of particles, and a resin. The resin may infiltrate the bound mixture without infiltrating the second plurality of particles such that the resin-infiltrated bound mixture may surround and may retain the second plurality of particles.

In some arrangements, the bound mixture consists of the binder and the first plurality of particles meaning the bound mixture only includes the binder and the first plurality of particles.

In some arrangements, the second plurality of particles may be made of a different material than the first plurality of particles. In other arrangements, the second plurality of particles may be made of the same material as the first plurality of particles.

In some arrangements, the binder may be a first binder and the bound mixture may be a first bound mixture, and the second plurality of particles may be combined with a second binder to form a second bound mixture. In some such arrangements, the first and second binders may be made of the same material. In some such arrangements, the second plurality of particles may be made of the same material as the first plurality of particles such that the first bound mixture is the same as the second bound mixture. In some arrangements, the first and second binders may be made of a different material. In some arrangements, the second plurality of particles may be unbound particles.

In some arrangements, the bound mixture may define pores into which the resin is infiltrated.

In some arrangements, the composite body may further include a coating applied to the bound mixture. In some such arrangements, the coating may form an outer layer of the composite body. In some arrangements, the coating may be any one or any combination of a spray metallization, fiber strands, a fiber weave, metal plating, or dry powders. Coatings may be wholly or partially made of zinc, aluminum, copper, steel, nickel, titanium, silver, gold, tantalum, cobalt chromium, or alloys of these metals as well as cermets including tungsten carbide cobalt and ceramics including alumina and chromium carbide.

In some arrangements, such fiber strands and such fiber weave may be any one or any combination of fiberglass, carbon fiber, and an aramid fiber. In some arrangements, such fiber strands and such fiber weave may be embedded in the resin. In some arrangements, fiber strands may be any one or any combination of chopped, loose, and mat. Such spray metallization may be any one or any combination of an arc spraying, thermal or flame spraying, and kinetic or cold spraying.

In some arrangements, the coating may be metallic plating, such as but not limited to any one or any combination of copper, nickel, and chrome plating. Metallic plating may be performed using electroplating or electroless plating. In some examples of electroplating, electrically conductive dry powders may be added to the resin before the resin fully cures or a conductive coating may be applied onto the composite body. An electrically charged plating material, e.g., electrolytic copper, may then be applied to the conductive powders or other conductive coating that has been applied to the composite body.

In some arrangements, the dry powders may be metallic or ceramic particles.

In some arrangements, the binder may be one part of a two-part curable resin.

In some arrangements, either or both of the first plurality of particles and the second plurality of particles may be made of any one or any combination of a sand, sodium bicarbonate, polymer, plaster, metal, ceramic, ash, organic powders, e.g., corn cob powder, including edible powders, and other particles which preferably may have a large surface area or may be porous and preferably may be more flexible, e.g., relative to sand, including but not limited to engineered particles. In some arrangements, either or both of the first plurality of particles and the second plurality of particles may be solid. In some arrangements, either or both of the first plurality of particles and the second plurality of particles may be hollow.

In some arrangements, the composite body may be in the form of an at least partially hollow shell.

In some arrangements, the resin may have been applied from a plurality of directions to define a part line.

In some arrangements, the bound mixture may define a gradient porosity within the composite body.

In some arrangements, the porosity of an interior of the composite body may be greater than the porosity of an exterior of the composite body opposite the interior of the composite body.

In some arrangements, the composite body may be a first composite body fused to a second composite body, which may be in the same form as the first composite body, to define a combined construct. In some arrangements, the composite body may define a core, and a shell may at least partially surround the core to define a combined construct. In some such arrangements, the shell may be a carbon fiber shell.

In accordance with another aspect of the technology, a composite body may be formed by a process. In this process, a first plurality of particles may be combined with a binder to form a bound mixture. An entire surface area of the bound mixture may be infiltrated with a resin such that the resin-infiltrated surface area of the bound mixture surrounds and retains a second plurality of particles unbound by the binder. In some arrangements, all of the bound mixture of the composite body may be infiltrated with the resin.

In some arrangements, the bound mixture consists of the binder and the first plurality of particles meaning the bound mixture only includes the binder and the first plurality of particles.

In accordance with another aspect of the technology, a composite body may be formed by a process. In this process, a first plurality of particles may be combined with a binder to form a bound mixture. The bound mixture may be infiltrated with a resin such that the resin-infiltrated bound mixture may surround and may retain the second plurality of particles without infiltrating the second plurality of particles.

In some arrangements, the first bound mixture consists of the binder and the first plurality of particles meaning the bound mixture only includes the binder and the first plurality of particles.

In some arrangements, the second plurality of particles may be made of a different material than the first plurality of particles. In other arrangements, the second plurality of particles may be made of the same material as the first plurality of particles.

In some arrangements, the binder may be a first binder and the bound mixture may be a first bound mixture, and the second plurality of particles may be combined with a second binder to form a second bound mixture. In some such arrangements, the first and second binders may be made of the same material. In some such arrangements, the second plurality of particles may be the same as the first plurality of particles such that the first bound mixture is the same as the second bound mixture. In some arrangements, the first and second binders may be made of a different material. In some arrangements, the second plurality of particles may be unbound particles.

In some arrangements, in combining the first plurality of particles with the binder, the binder may be printed through a 3D printing head onto particles supported by a substrate. In some arrangements, unbound particles supported by the substrate may be separated from the composite body. In some arrangements, particles supported by the substrate may not adhere to each other.

In some arrangements, a portion or portions of the bound mixture may be removed such that substantially the entire thickness of the composite body contains the resin.

In some arrangements, in combining the first plurality of particles with the binder, a first section defined by unit cells may be formed extending from a second section. In some such arrangements, the second section may be substantially solid.

In some arrangements, the bound mixture infiltrated with the resin may be coated. In some such arrangements, the coating may form an outer layer of the composite body. In some arrangements, the coating may be any one or any combination of a spray metallization, fiber strands, a fiber weave, metal plating, or dry powders. Coatings may be wholly or partially made of zinc, aluminum, copper, steel, nickel, titanium, silver, gold, tantalum, cobalt chromium, or alloys of these metals as well as cermets including tungsten carbide cobalt and ceramics including alumina and chromium carbide.

In some arrangements, such fiber strands and such fiber weave may be any one or any combination of fiberglass, carbon fiber, and an aramid fiber. In some arrangements, such fiber strands and such fiber weave may be embedded in the resin. In some arrangements, fiber strands may be any one or any combination of chopped, loose, and mat. Such spray metallization may be any one or any combination of an arc spraying, thermal or flame spraying, and kinetic or cold spraying.

In some arrangements, the coating may be metallic plating, such as but not limited to any one or any combination of copper, nickel, and chrome plating. Metallic plating may be performed using electroplating or electroless plating. In some examples of electroplating, electrically conductive dry powders may be added to the resin before the resin fully cures or a conductive coating may be applied onto the composite body. An electrically charged plating material, e.g., electrolytic copper, may then be applied to the conductive powders or other conductive coating that has been applied to the composite body.

In some arrangements, the dry powders may be metallic or ceramic particles.

In some arrangements, the binder may be one part of a two-part curable resin.

In some arrangements, the coating may surround the bound mixture infiltrated with the resin. In some such arrangements, unbound particles inside the coating may be removed.

In some arrangements, either or both of the first plurality of particles and the second plurality of particles may be made of any one or any combination of a sand, sodium bicarbonate, polymer, plaster, metal, ceramic, ash, organic powders, e.g., corn cob powder, including edible powders, and other particles which preferably may have a large surface area or may be porous and preferably may be more flexible, e.g., relative to sand, including but not limited to engineered particles. In some arrangements, either or both of the first plurality of particles and the second plurality of particles may be solid. In some arrangements, either or both of the first plurality of particles and the second plurality of particles may be hollow.

DETAILED DESCRIPTION

Figure 1A:
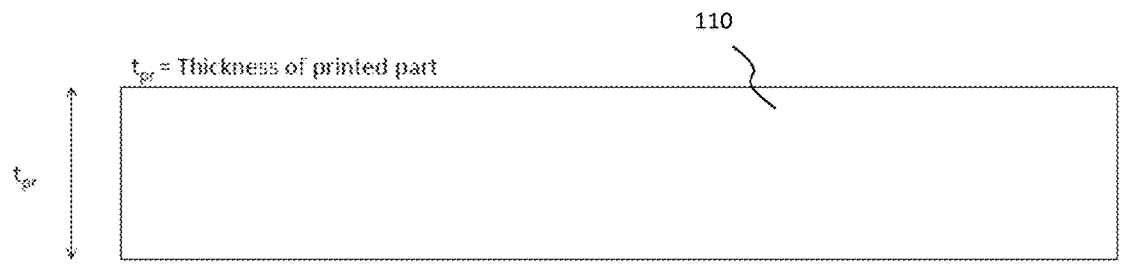
FIGS. 1A-1C are schematics illustrating steps for preparing a composite body in accordance with an aspect of the technology.
Figure 1B:
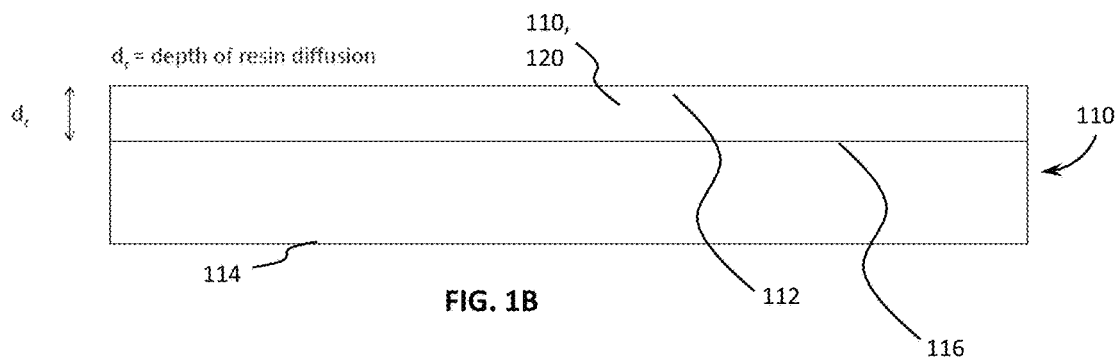
Figure 1C:
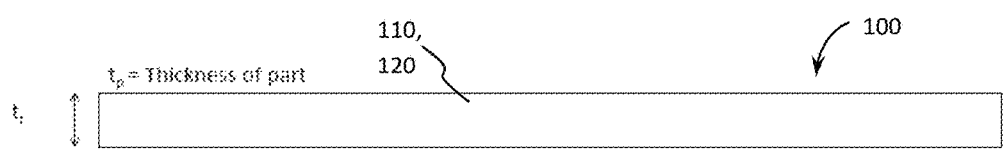

Referring now to the example of FIGS. 1A-1C, composite body 100 is made of base body 110 and cured resin 120. Base body 110 is formed of a plurality of particles bound by a liquid binder. The plurality of particles may be but are not limited to being silica sand or powdered materials, which may be but are not limited to being made from polymers, plaster, metals, ceramics, ash, salt, sodium bicarbonate, food materials (e.g., sugar, flour), and other powders dissolvable by water. Ceramics, as used herein, may be wholly or partially crystalline materials including glass-ceramic, or noncrystalline materials including glass. As in this example, the liquid binder of base body 110 may be 3D printed onto the plurality of particles using a binder jetting process. Various binders are used during such 3D printing processes, such as but not limited to furan resin used by Voxeljet AG and the ExOne Company, LLC, "Part A" of a two-part curable resin system, e.g., a first part of a two-part epoxy, phenolic, silicate, aqueous, and glycol. In some arrangements, an activator such as but not limited to certain acids, such as toluenesulfonic acid, is mixed with the plurality of particles in order to activate certain binders that may be used, e.g., furan resin.

The plurality of particles of composite body 100 are loosely held together by the binder such that the composite body is inherently porous. As demonstrated by FIG. 1B, resin 120, which may be but is not limited to being a "Part B" of a two-part curable resin system, e.g., a second part of a two-part epoxy, silicone, acrylic resin, and fiber reinforced plastic, is infiltrated or impregnated into an interior of porous base body 110 through first surface 112 of base body 110 to an interior edge 116 of resin 120. As in this example, resin 120 may form a surface of composite body 100. As demonstrated by FIG. 1C, in-process portions of base body 110 not infiltrated with resin 120 are removed. In this manner, the thickness of composite body 100 may be defined by the depth of diffusion of resin 120 into base body 110 at edge 116 during processing of the composite body, and thus the composite body may be strengthened by resin 120 throughout an entire volume of the composite body. In some arrangements, resin may be applied to base body 110 such that the resin fully infiltrates the entirety of the base body. In this manner, no removal of portions of base body 110 without resin is necessary. Such a configuration may be useful for preparing solid prototypes or tooling, or other functional parts.

Figure 2:
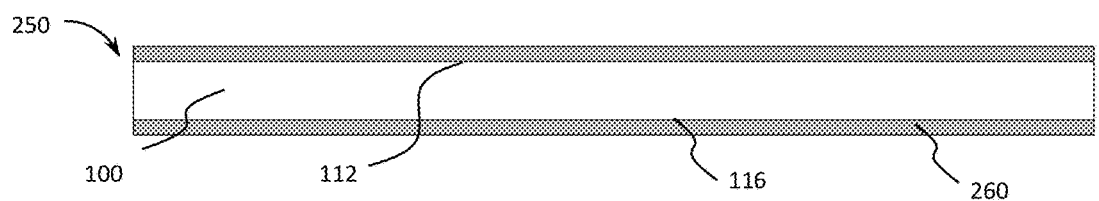
FIG. 2 is a schematic of a composite assembly in accordance with another aspect of the technology.

As shown in FIG. 2, composite assembly 250 includes composite body 100 and coating 260. As in this example, coating 260 may cover composite body 100 at first surface 112 and at edge 116 of the composite body. As in this example, coating 260 may extend partially into the composite body 100, i.e., beneath surface 112 of base body 110 and edge 116 of resin 120 (defining a surface of composite body 100), although in other arrangements the coating may not extend into the composite body. Coating 260 may be but is not limited to being a spray metallization, a carbon fiber layer, or a fiberglass layer.

Figure 3:
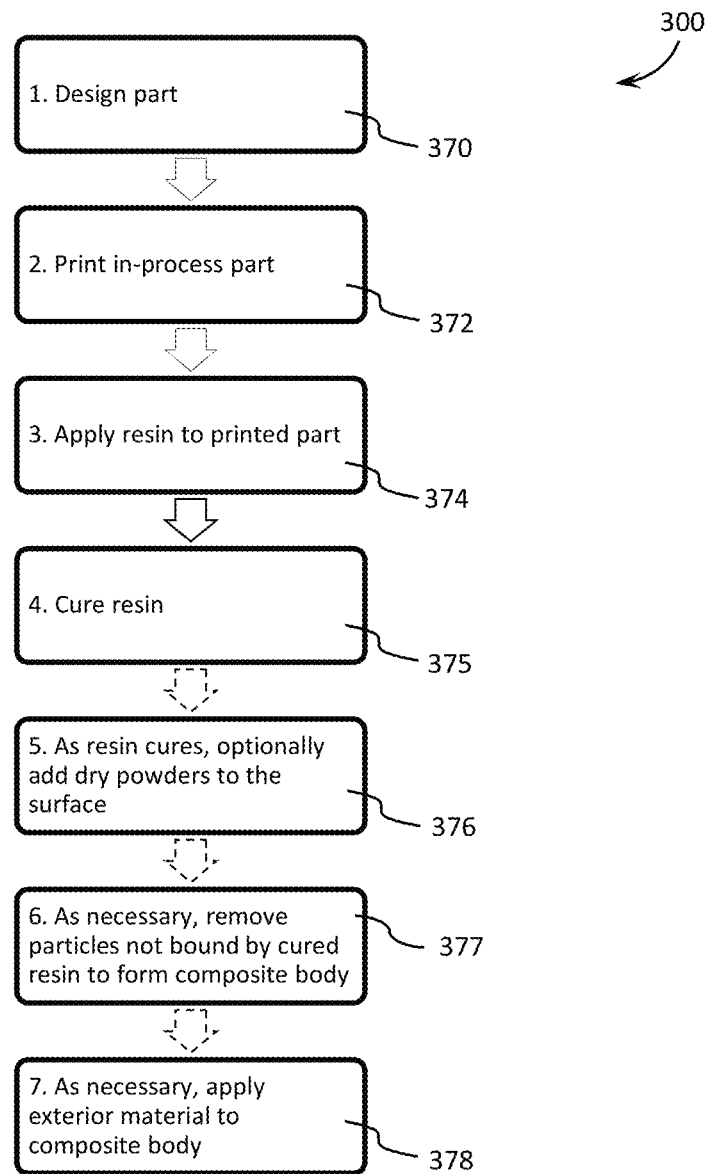
FIG. 3 is a process flow diagram providing a summary of the steps for preparing a composite body or assembly in accordance with another aspect of the technology.

Referring now to FIG. 3, composite body 100 and composite assembly 250 may be prepared using process 300. As shown in step 370, a desired printed part, such as but not limited to base body 110, is designed using computer-aided design and modeling (CAD) software, such as but not limited to any CAD package configured to create 3D solid models convertible to a format readable by the desired 3D printing machine. Such packages include but are not limited to SpaceClaim® 3D Modeling Software, SolidWorks® by Dassault Systemes, NX by Siemens Product Lifecycle Management Software Inc., Inventor®, 123D, and AutoCAD® by Autodesk®, and Geomagic® by 3D Systems, Inc. The drawing file generated by the CAD software is then converted into the readable format, e.g., an .STL, .STP, .3MF, or .IGS file, for use by a 3D printing machine. In alternative arrangements, the CAD package used may perform slicing of the 3D solid model and directly convert the model to machine code readable by the 3D printing machine. At step 372, an in-process part corresponding to the shape of the designed part is fabricated using a 3D printing machine, such as but not limited to any of model nos. VX-200, VX-500, VXC-800, VX-1000, VX-2000, and VX-4000 by Voxeljet AG, model nos. Exerial, S-Max, M-Flex, Innovent, X1-Lab by The ExOne Company, LLC, model nos. 210, 310, 410, 450, and 650 by Zcorp, Inc., and model nos. ProJet CJP 260C, ProJet CJP 360, ProJet CJP 460Plus, ProJet CJP 660Pro, and ProJet CJP 860Pro by 3D Systems, Inc. In processing the in-process part, a layer of a plurality of particles as described previously herein is deposited on a table of the 3D printing machine or other suitable substrate placed on such table. A roller, brush, or scraper is typically used to evenly spread the plurality of particles. A liquid binder is then extruded from a nozzle of the 3D printing machine to form a first patterned layer of loosely bound particles in the deposited layer of the plurality of particles, the patterned layer being a single layer of the processed part. After the first patterned layer is formed, the table and thus the particle bed is lowered, and a new layer of a plurality of the particles is deposited over the previous patterned layer. Another layer of binder is then applied to the additional layer of the particles to form an additional patterned layer and to fuse the additional patterned layer to the previous patterned layer. These depositing and patterning sub-steps are performed until a porous printed part, such as base body 110, is formed.

At step 374, resin, such as but not limited to resin 120, is applied either or both of onto or beneath a surface of the printed part, such as first surface 112 of base body 110, and then infiltrates, i.e., absorbs and diffuses, into and through the printed part. Resin 120 preferably should be chosen so as not to soften the binder used to fabricate the printed part and thereby weaken the printed part. The resin may be formed by but is not limited to being formed by any one or any combination of polyester systems, acrylic systems, epoxy systems, polyurethane systems, cationic ultraviolet (UV) curable epoxy systems, epoxy-amine and cycloaliphatic epoxy systems, free radical UV curable acrylate systems, urethane systems including isocyanate-polyol and isocyanate-amine, cyanoacrylate. The resin may be applied onto the printed part in a number ways. In some arrangements, the resin may be any one or any combination of brushed, rolled, or sprayed onto the printed part, while in other arrangements, the printed part may be submerged into the resin to infiltrate the printed part. When brushed, rolled, or sprayed onto the printed part, the depth of infiltration of the resin may be governed by the pot life and viscosity of the resin. When the printed part is submerged in the resin, infiltration of the resin throughout the entire volume of the printed part is made possible. To further enhance the depth of infiltration, a vacuum may be used to remove air in the printed part while the resin is along the surface or within the part, thereby creating a differential pressure during introduction of the resin. It is to be understood that as the amount of resin introduced per area of any surface of the printed part increases, the deeper the resin flows into the printed part below the given surface area.

At step 375, the resin is cured, such as by the application of heat, or allowed to cure, such as by ambient air or forced air drying, in which the resin hardens. In this manner, the tensile and compressive strength of the composite body is increased beyond the tensile and compressive strengths of the printed part without the resin. At optional step 376, a dry powder, i.e., additional particles, are added to at least a portion of the surface of the printed part infiltrated with the resin during the curing stage of the resin. The dry powders may be any one or any combination of brushed onto the printed part, sprayed onto the printed part, or applied to the printed part by dipping the printed part into a volume of the dry powder. In some arrangements, the applied dry powder then may be brushed to infuse the dry powder between the bound particles of the printed part. In this manner, the surface of the part may be smoothened in which smoothening of the surface of the printed in-process part, e.g., sanding on sand, is avoided. The resin infiltrated into the printed part will wick into the dry powder and fill in gaps between the particles of the dry powder. Different finishes may be formed by adding the powder at different points throughout the curing cycle. The dry powder may be but is not limited to being any one or any combination of aluminum, copper, steel, nickel, bronze, Teflon® coating, a ceramic, and alumina trihydrate.

At step 377, excess particles that are not bound by the cured resin are then removed by way of any one or any combination of gravity, shaking, scraping, media blasting, other mechanical means, dissolution by water when water soluble particles are used, and application of a vacuum causing separation of loose particles from the portion of the printed part bound by the cured resin to form a composite body, such as composite body 100.

At optional step 378, an exterior material, such as but not limited to coating 260, is applied to one or more surfaces of the composite body, such as but not limited to composite body 100, to form a composite assembly, such as composite assembly 250. In some arrangements, the coating may be complete or chopped fiber strands or woven fibers. Such fibers may be loose or may be formed into a mat. The fibers may be but are not limited to being made of fiberglass, carbon fiber, or an aramid fiber, e.g., Kevlar® fiber. The coating optionally may be applied during the curing of the resin such that such fibers may become embedded in the resin to form a composite with the resin upon curing of the resin.

In some arrangements, the coating may be metallic. In such arrangements, the coating may be applied using spray metallization. In some arrangements, the spray metallization used for coating may be any one or any combination of an arc spraying, thermal or flame spraying such as that used by Flame Spray Inc., and kinetic or cold spraying. In preferable arrangements, the coating may be wholly or partially made of zinc, aluminum, copper, steel, nickel, titanium, silver, gold, tantalum, cobalt chromium, or alloys of these metals as well as cermets including tungsten carbide cobalt and ceramics including alumina and chromium carbide.

In some arrangements, the coating may be metallic plating, such as but not limited to any one or any combination of copper, nickel, and chrome plating. Metallic plating may be performed using electroplating or electroless plating. In some examples of electroplating, electrically conductive dry powders, i.e., particles, may be added to the resin before the resin fully cures as at step 376 or a conductive coating may be applied, such as by spraying, onto the composite body. An electrically charged plating material, e.g., electrolytic copper, may then be applied to the conductive powders or other conductive coating that has been applied to the composite body.

In some arrangements, the exterior material may be a topcoat, such as but not limited to a paint or resin which may have different properties than the resin infiltrating the printed part. In this manner, the composite body may be given a variety of surface finishes. The topcoat may be color tinted to provide a desirable finish color. The topcoat may be a metal-filled resin to provide additional strength and wear properties as well as to create a desired metallic effect. The same or different topcoats may be layered to provide different surface effects.

Referring again to FIG. 1B, in an alternative arrangement of composite body 100, resin 120 is infiltrated through second surface 114 of base body 110 opposite first surface 112 of the base body in addition to being infiltrated through first surface 112. In this arrangement, the resin that infiltrates both first surface 112 and second surface 114 is cured after infiltration. Such additional infiltration allows for the fabrication of either or both of thicker and larger volume composite bodies.

In some alternative arrangements, the base body may be formed as described previously herein such that the porosity of either of first surface 112 of base body 110 and second surface 114 of the base body may be greater than the porosity of the other of the first and second surfaces of the base body. In this manner, when resin 120 is infiltrated into the base body, the strength on the side of the formed composite body adjacent to the first surface of the base body may be different than the strength on the side of the formed composite body adjacent to the second surface of the base body.

In some arrangements, the porosity of the printed part may be controlled. In such arrangements, the patterned layers may be formed in a random, e.g., non-repeating, order or in a repeating pattern, e.g., as a plurality of tessellated unit cells. Such unit cells may be in the form of polyhedra, such as but not limited to tetrahedra, octahedra, and dodecahedra.

Figure 4A:
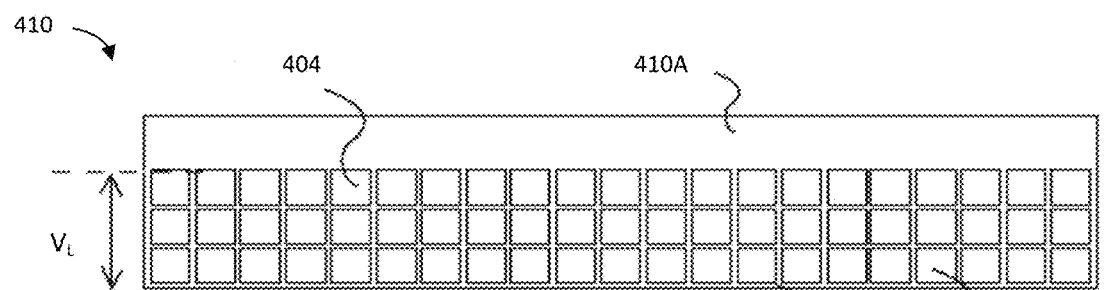
FIGS. 4A and 4B are schematics illustrating steps for preparing a composite body in accordance with another aspect of the technology.
Figure 4B:
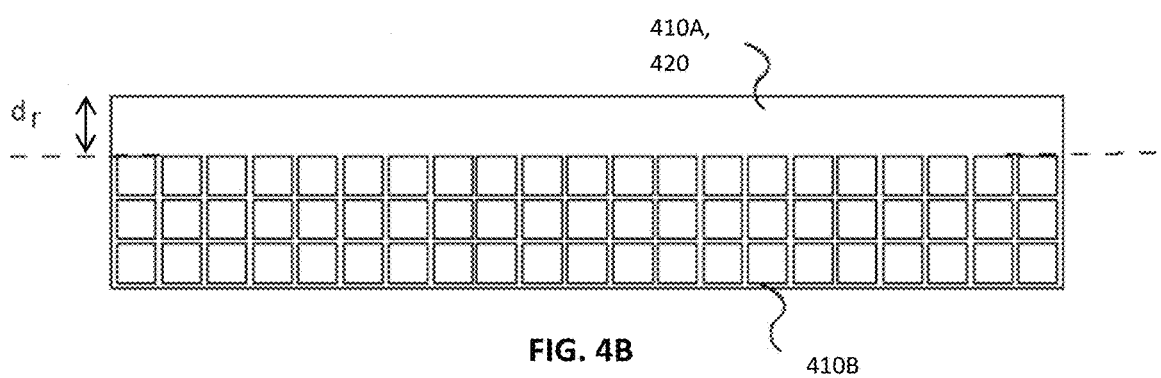
Figure 4C:
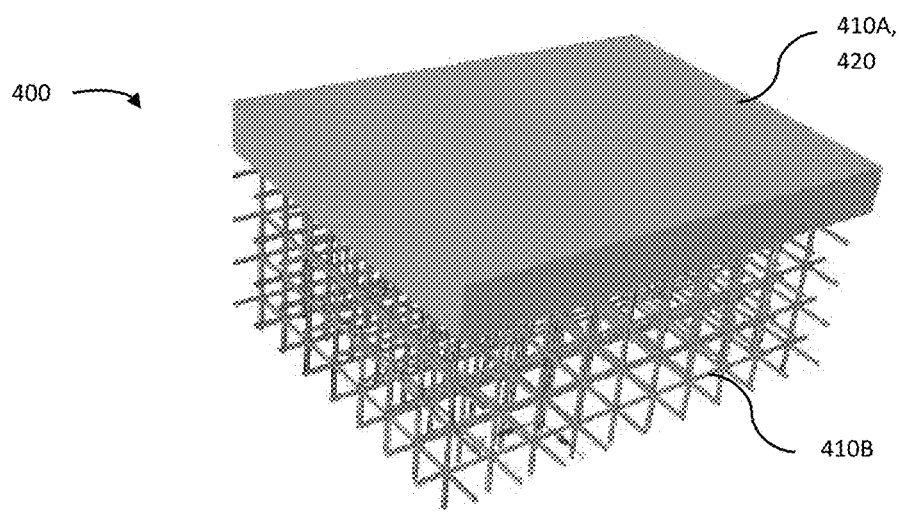
FIG. 4C is a perspective view of the composite body of FIG. 4B.

Referring to FIGS. 4A-4C, base body 410 used in the formation of composite body 400 is the same or substantially the same as base body 110 with the exception that base body 410 includes first base body section 410A and second base body section 410B extending from the first base body section. Both first and second base body sections 410A, 410B may be inherently porous in the same manner as base body 110. In the example shown, second base body section 410B is made up of tessellated unit cells that define a plurality of cubes. Each cube shares at least one face with another cube of second base body section 410B. Such a pattern provides rigidity for handling of base body 410 and subsequently composite body 400 while being easier to remove, due to its lower density, than the portion of base body 110 removed from the rest of base body 110 in the formation of composite body 100. This pattern or other such patterns defining large pores may be formed using an additive manufacturing machine in a manner similar to that described previously herein with respect to composite body 100 and composite assembly 250 that, for example, may apply a binder to particles at only predetermined locations of each layer during a build process forming a printed part. In this manner, gaps 404 filled with unbound particles may be formed between the plurality of cubes of second base body 410B.

Figure 4D:
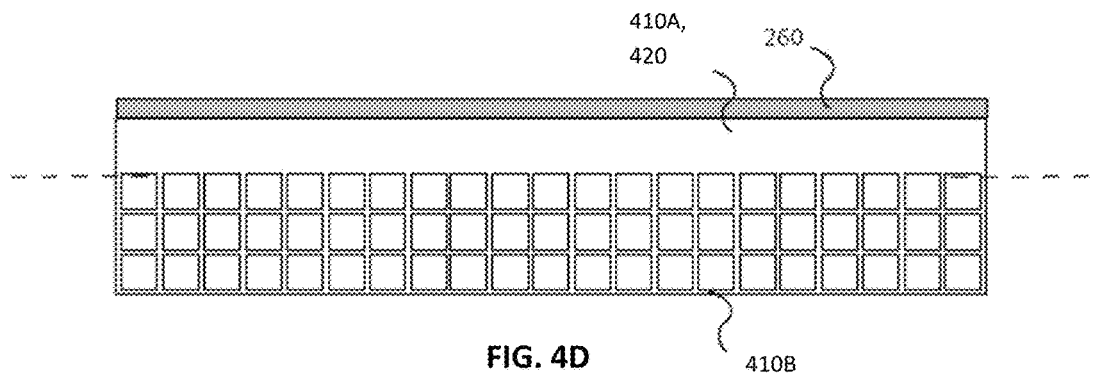
FIGS. 4D-4F are schematics illustrating steps for preparing a composite assembly from the composite body of FIG. 4B in accordance with another aspect of the technology.

As demonstrated by FIG. 4B, resin is infiltrated into an interior of first base body section 410A up to at least the intersection of first body section 410A and second base body section 410B, i.e., lattice volume $V_L$, in the same or a substantially similar manner that resin 120 is applied to base body 110 in forming composite body 100. As shown in FIG. 4D, in the same manner as the example shown in FIG. 2, coating 260 may be applied to first base body section 410A.

Figure 4E:
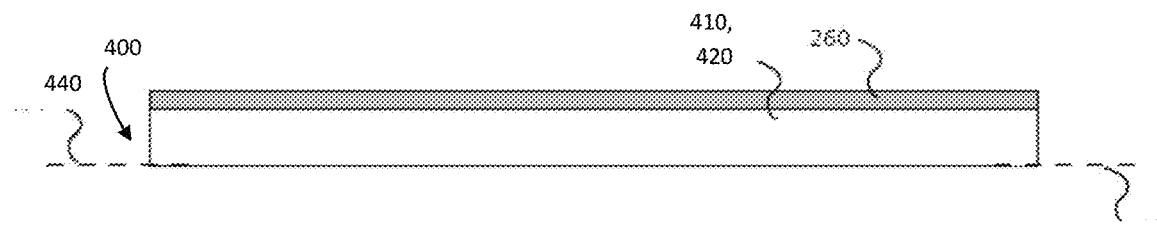
Figure 4F:
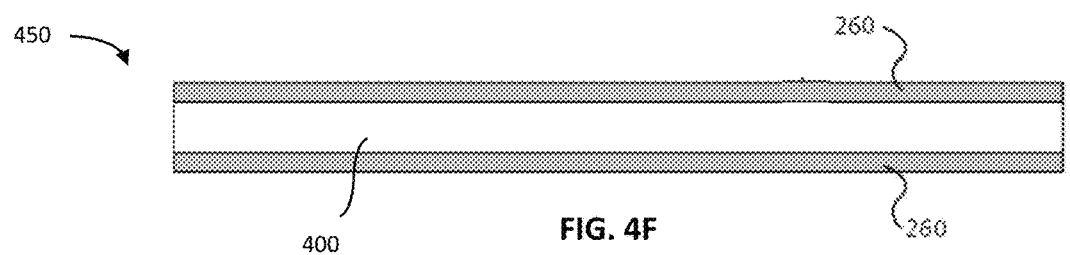

As shown in FIG. 4E, second base body section 410B may be severed from first base body section 410A at cut plane 440 to form composite body 400. As shown in FIG. 4F, coating 260 is applied to the side of first base body section 410A severed from second base body section 410B. In this manner, composite assembly 450 is formed in which the composite assembly is the same or substantially the same as composite assembly 250.

Figure 5A:
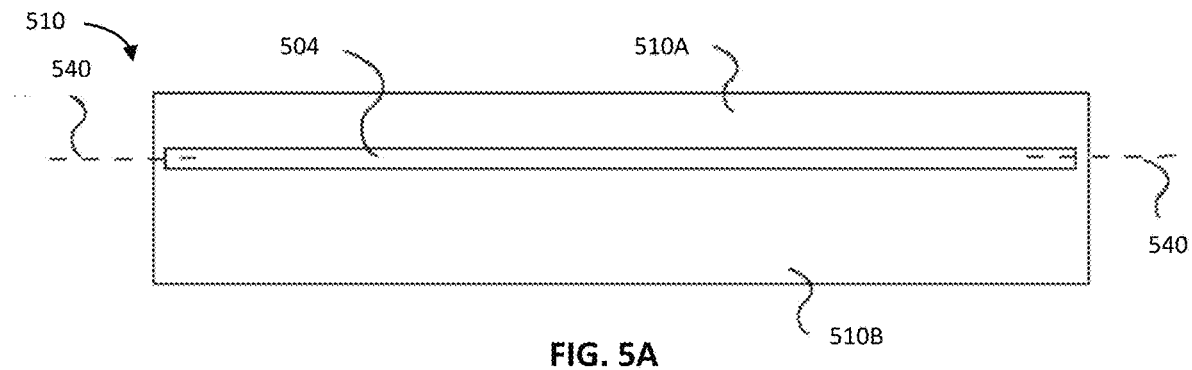
FIGS. 5A and 5B are schematics illustrating steps for preparing a composite body in accordance with another aspect of the technology.
Figure 5B:
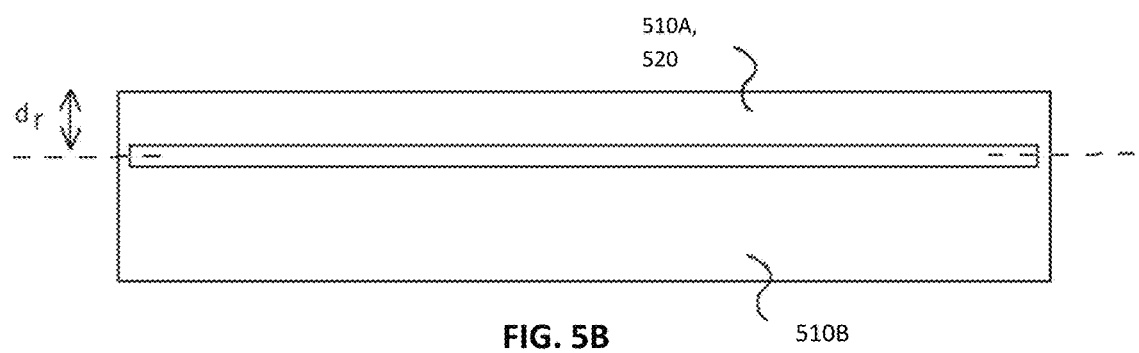
Figure 5C:
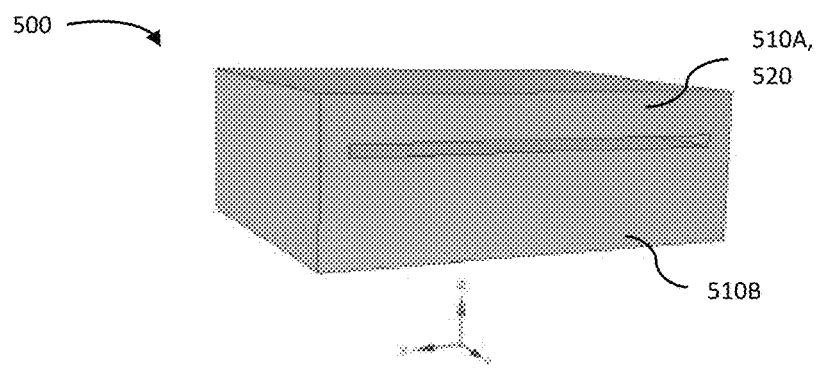
FIG. 5C is a perspective view of the composite body of FIG. 5B.

Referring now to FIGS. 5A-5C, base body 510 used in the formation of composite body 500 is the same or substantially the same as base body 410 with the exception that base body 510 includes first base body section 510A and second base body section 510B extending from the first base body section. Both first and second base body sections 510A, 510B may be inherently porous in the same manner as base body 410 (and transitively base body 110). Base body 510 is formed, such as by the additive manufacturing process described previously herein, such that first base body section 510A meets second base body section 510B at a perimeter of the base body. In this manner, gaps 504 filled with unbound particles may be formed between the first and second base bodies 510A, MOB. In this manner, the first and second base bodies 510A, 510B may be severed from each other more easily than removing a portion of base body 110 in the example of forming composite body 100.

Figure 5D:
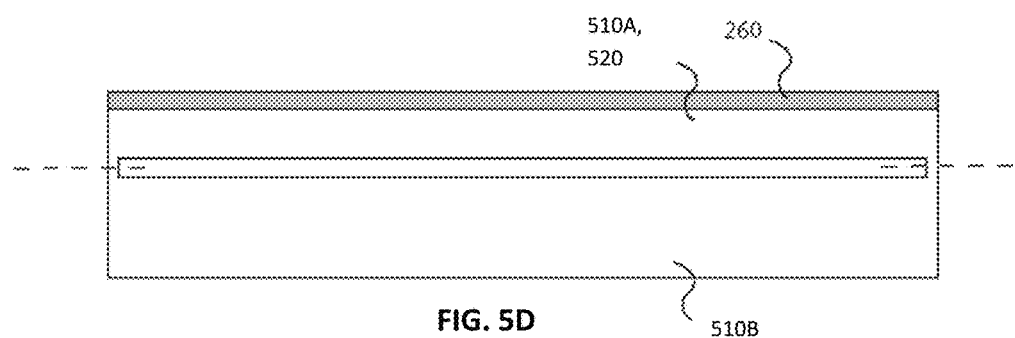
FIGS. 5D-5F are schematics illustrating steps for preparing a composite assembly from the composite body of FIG. 5B in accordance with another aspect of the technology.
Figure 5E:
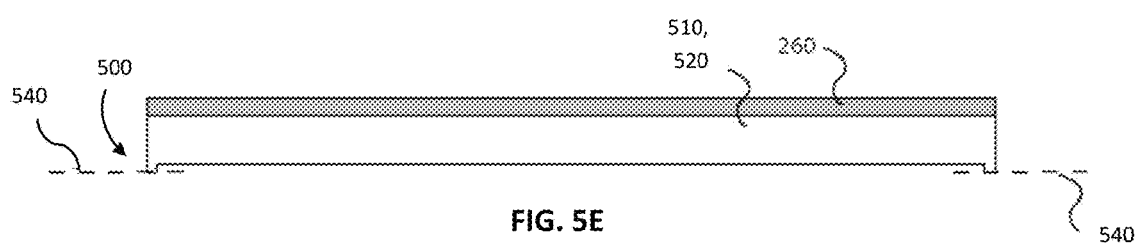
Figure 5F:
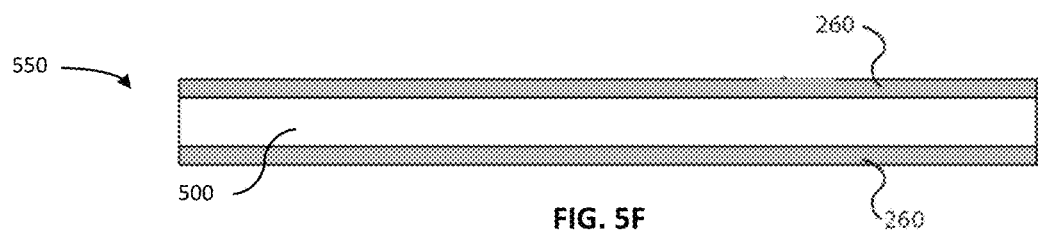

As demonstrated by FIG. 5B, resin is infiltrated into an interior of first base body section 510A up to at least the intersection of first body section 510A and second base body section 510B in the same or a substantially similar manner that resin 120 is applied to base body 110 in forming composite body 100 and resin 420 is applied to base body 410 in forming composite body 400. As shown in FIG. 5D, in the same manner as the example shown in FIGS. 2 and 4D, coating 260 may be applied to first base body section 510A. As shown in FIG. 5E, second base body section 510B may be severed from first base body section 510A to form composite body 500. As shown in FIG. 5F, coating 260 is applied to the side of first base body section 510A severed from second base body section 510B. In this manner, composite assembly 550 is formed in which the composite assembly is the same or substantially the same as composite assemblies 250, 450.

Figure 6:
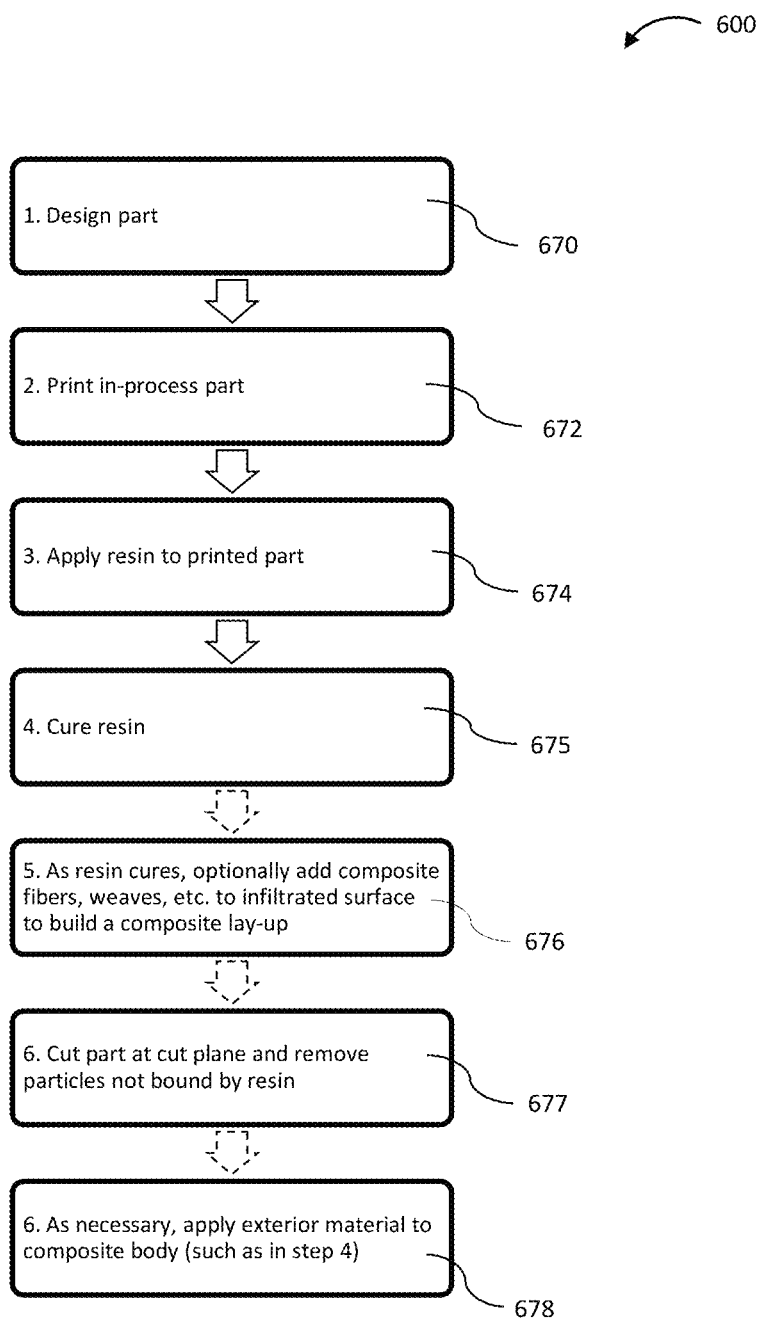
FIG. 6 is a process flow diagram providing a summary of the steps for preparing a composite body or assembly in accordance with another aspect of the technology.

As shown in FIG. 6, composite bodies 400, 500 and composite assemblies 450, 500 may be prepared using process 600. At step 670, a desired printed part, such as but not limited to base bodies 410, 510 are designed in the same manner as described previously herein with respect to step 370 of process 300. At step 672, an in-process part corresponding to the shape of the designed part is fabricated using a 3D printing machine in the same manner as described previously herein with respect to step 372 of process 300. At step 674, resin, such as but not limited to resin 420, 520 is applied either or both of onto or beneath a surface of the printed part in the same manner resin 120 is applied to the printed part as described previously herein with respect to step 374 of process 300. At step 675, the resin is cured or allowed to cure in the same manner the resin is cured or allowed to cure as described previously herein with respect to step 375 of process 300. At optional step 676, fibers may be applied to the resin infiltrated surface of the printed in-process part to form a composite lay-up. Such fibers may be in the form of any of the complete or chopped fiber strands or woven fibers as described previously herein with respect to step 378 of process 300. At step 677, sections of the in-process part, such as second base body sections 410B, 510B are severed from the in-process part, such as first base body sections 410A, 410B infiltrated with resin, and any particles not bound by the resin are removed. At optional step 678, an exterior material, such as but not limited to coating 260, is applied to one or more surfaces of the composite body, such as but not limited to composite bodies 400, 500 to form a composite assembly, such as composite assemblies 450, 550. Such exterior material may be in the form of the exterior material described previously herein with respect to step 378 of process 300. In some arrangements, any of the steps of process 600 may be used with process 300 and vice versa. As examples, steps 676 and 677 may be utilized with process 300 and step 375 may be utilized with process 600.

In some arrangements for preparing composite assemblies for use as sacrificial tooling, which preferably may include the use of process 300 or process 600, an in-process composite body may be coated but is not limited to being coated by plating copper, by hydroforming sheet metal, by spray metallizing, or by plating copper followed by hydroforming or spray metallizing onto one or more surfaces, and in many arrangements the entirety of the exterior, of the in-process composite body to a desired thickness for the coating (and thus the coated composite body at this stage). Subsequently, the coating is separated from the in-process composite body by dissolving the in-process composite body with an appropriate solvent, e.g., methylene chloride. In some arrangements, in addition to dissolving the in-process composite body, the copper plating when used may also be dissolved, for example, by applying sulfuric acid to the coating.

Figure 7A:
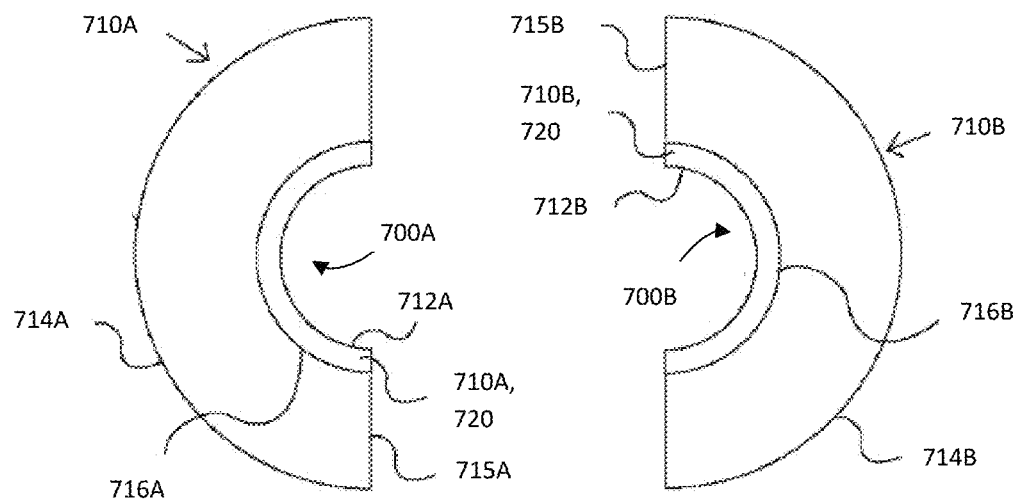
FIGS. 7A and 7B are schematics illustrating steps for preparing an assembly of composite bodies in accordance with another aspect of the technology.
Figure 7B:
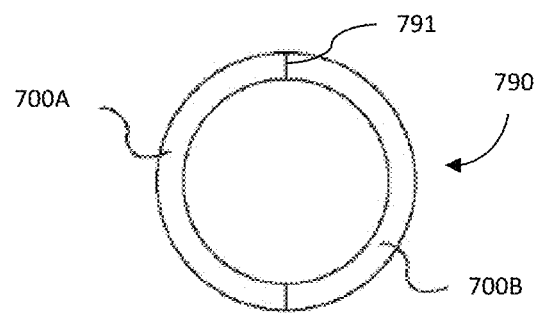

Referring now to FIGS. 7A and 7B, resin 720 may be infiltrated into each of base bodies 710A, 710B, which preferably may be 3D printed parts prepared using process 300 or alternatively process 600 in which in some arrangements tessellated unit cells may be formed (see FIGS. 4A-4C), through respective concave inner surfaces 712A, 712B and cured. Base bodies 710A, 710B may have a thickness sufficient to absorb resin 720 to a predetermined depth of diffusion at respective edges 716A, 716B of resin 720, as in the example of FIG. 7A. As shown by the differences between FIGS. 7A and 7B, sections between respective edges 716A, 716B of resin 720 and convex outer surfaces 714A, 714B which are not infiltrated with resin are removed to leave respective composite bodies 700A, 700B. As in this example, base bodies 710A, 710B and composite bodies 700A, 700B may be symmetrical to each other such that end surfaces 715A, 715B of respective composite bodies 700A, 700B may be adhered together, such as by but not limited to being by an epoxy, to form hollow article 790. In some arrangements, hollow article 790 may include part line 791 at the interface of composite bodies 700A, 700B. As in the example of FIG. 2, a coating, which may be but is not limited to being a spray metallization or fiberglass, may be applied to cured inner surfaces 712A, 712B to further strengthen either or both composite bodies 700A, 700B.

Figure 8A:
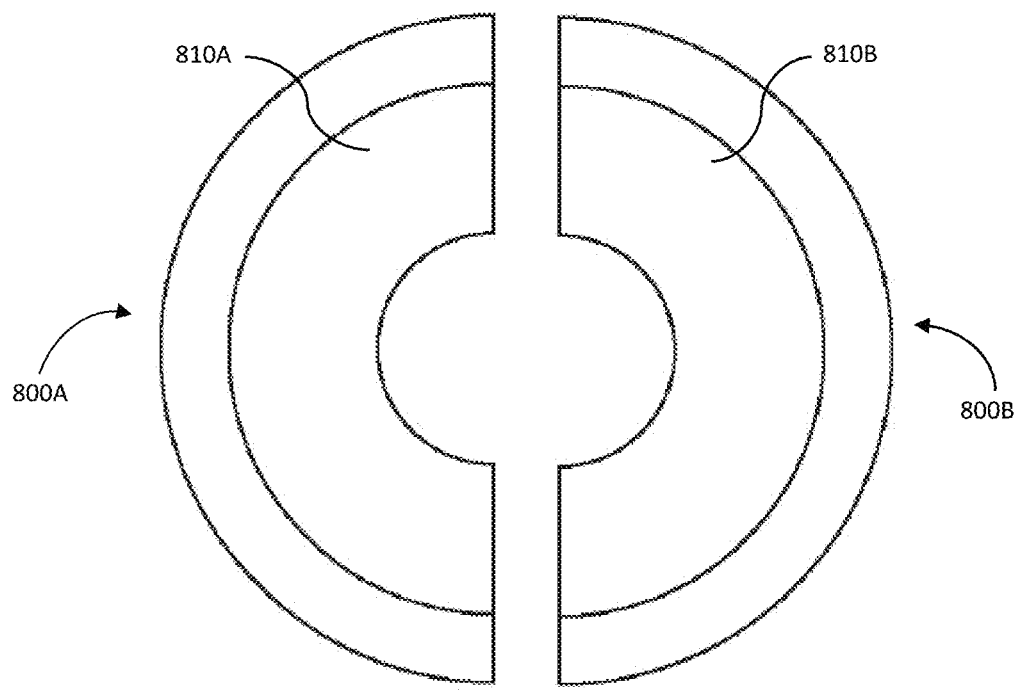
FIGS. 8A and 8B are schematics illustrating steps for preparing an assembly of composite bodies in accordance with another aspect of the technology.
Figure 8B:
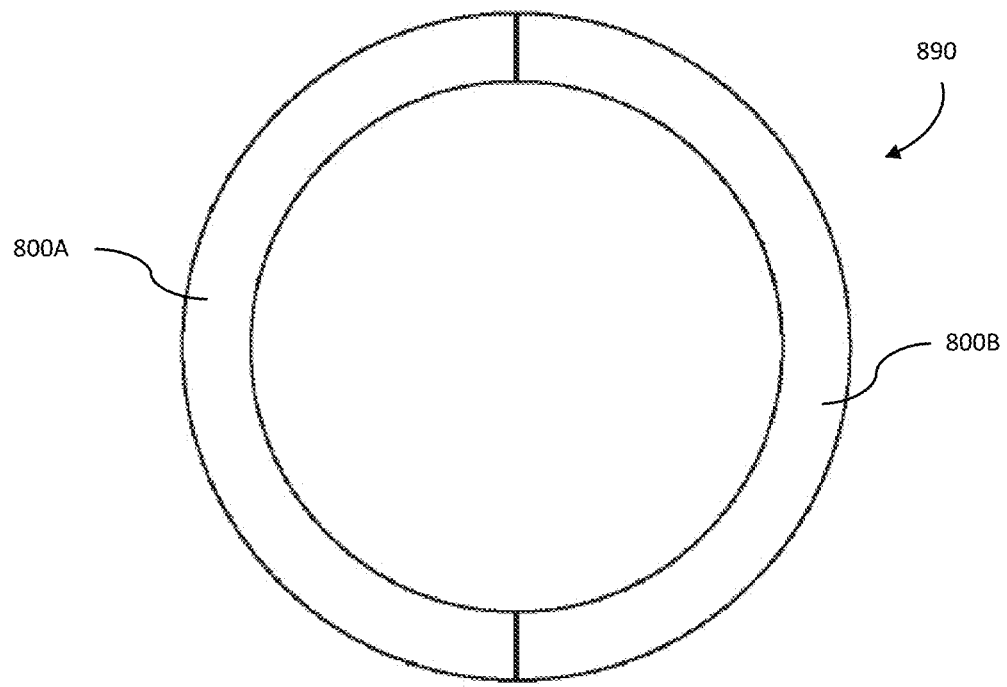

As shown in FIGS. 8A and 8B, in a similar arrangement to that shown in FIGS. 7A and 7B, resin may be infiltrated into each of base bodies 810A, 810B, which preferably may be 3D printed parts prepared using process 300 or alternatively process 600 in which in some arrangements tessellated unit cells may be formed (see FIGS. 4A-4C), through convex outer surfaces and cured. The portions of base bodies 810A, 810B which are not infiltrated with resin are removed to leave respective composite bodies 800A, 800B. In a similar manner to the formation of hollow article 790, in this example, composite bodies 800A, 800B may be symmetrical to each other such that their end surfaces may be adhered together, such as by but not limited to being by an epoxy, to form hollow article 890.

Figure 9:
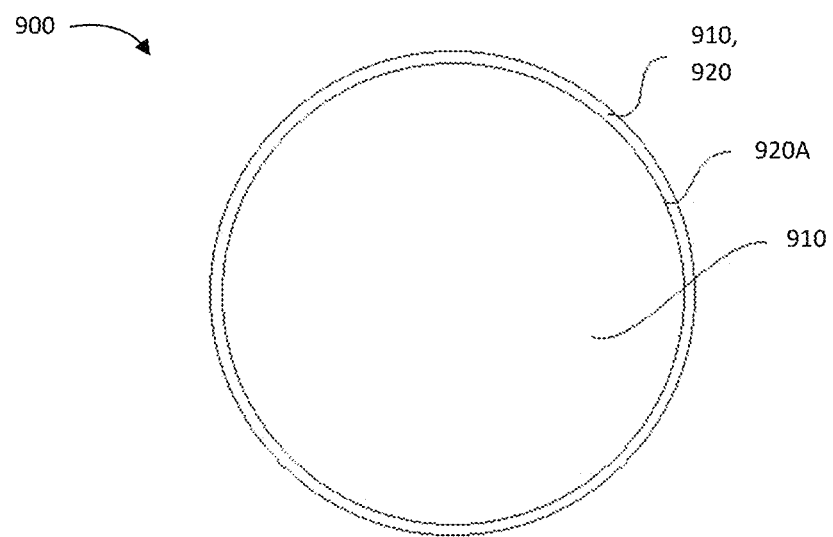
FIG. 9 is a schematic of a composite body in accordance with another aspect of the technology.
Figure 10A:
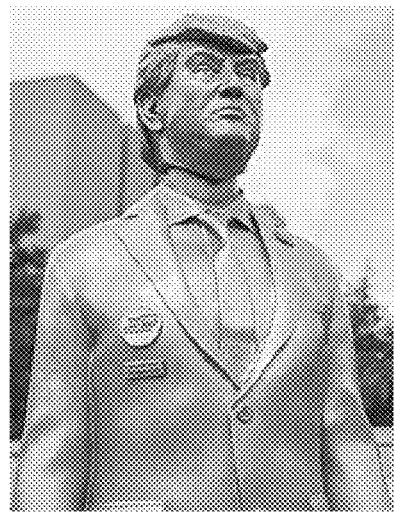
FIGS. 10A-10F are examples of articles prepared in accordance with various aspects of the technology.
Figure 10B:
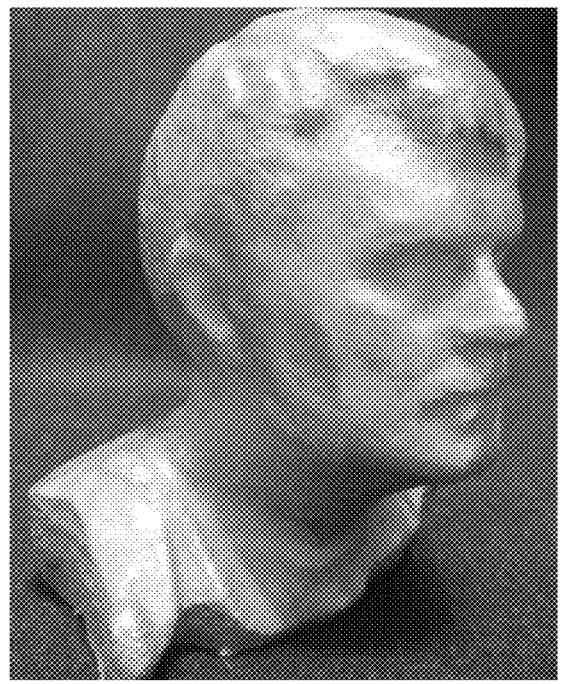
Figure 10C:
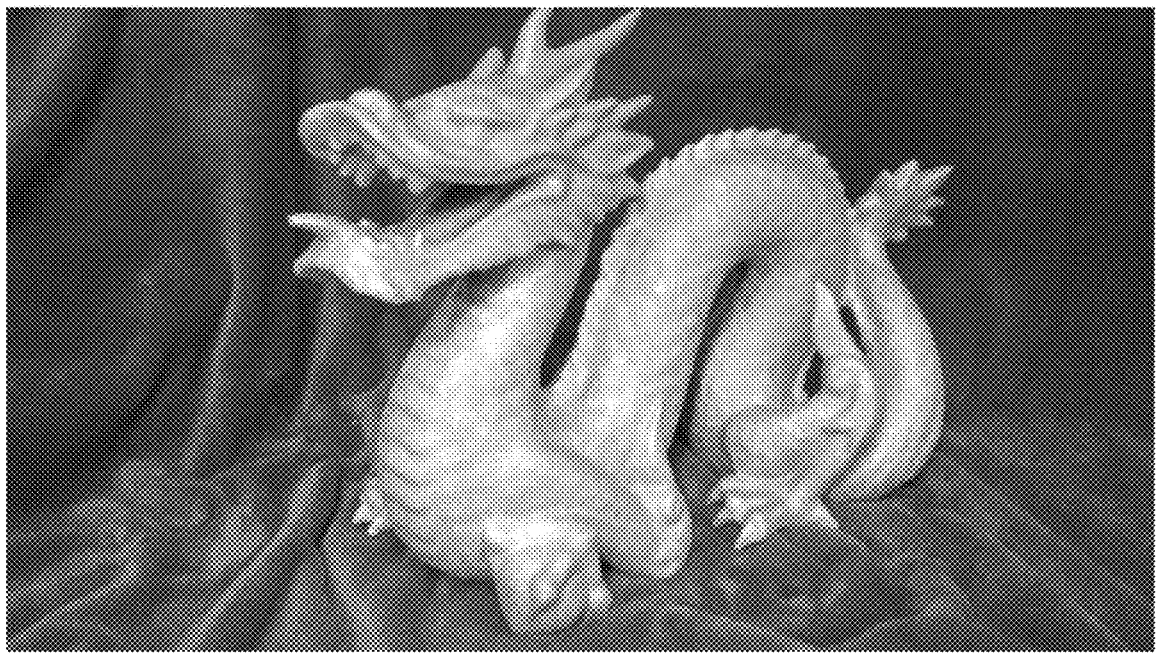
Figure 10D:
Figure 10E:
Figure 10F:

Referring now to FIG. 9, composite body 900 includes base body 910 infiltrated by resin 920. Base body 910 is formed of a plurality of particles bound by a liquid binder. As shown, base body 910 is infiltrated by resin 920 to edge 920A such that the resin-infiltrated base body surrounds and retains the remainder of the base body that is not infiltrated by the resin. In this manner, for some applications, removal of the portion of the base body that is not infiltrated by the resin is unnecessary. In some alternative arrangements, the portion of the base body that is not infiltrated by the resin may be formed of either or both different particles and a different binder than those of the base body used to form the resin-infiltrated base body. In some alternative arrangements, the portion of the base body that is not infiltrated by the resin and is surrounded by the resin-infiltrated base body may be a combination of unbound particles, i.e., particles that are not bound by a binder, and bound particles, i.e., particles bound by a binder, or may be only unbound particles.

The technology described herein may be used in a number of applications. Some possible end uses include prototype parts for display, exhibit, testing, etc.; large waterproof prototypes such as for kitchen and bathroom fixtures including but not limited to countertops, sinks, toilets, and showers as well as for commercial/industrial tanks, etc.; forming tools for hydroforming, stamping, vacuum forming; casting tools for resins, polymers, low melt alloys, and cementitious products; lay-up tools for composite products; metal plated parts; decorative plated parts; hammer bucks and fitment bucks, especially for automotive applications; jigs and fixtures; art, sculpture, portraiture, and custom parts; monuments and memorials; and signage. To fabricate a thin shell structure, such as a panel, curable resin may be applied to a base body as described previously herein and excess particles of the base body may be removed to form a composite body in which the resin is infiltrated throughout the thickness of the composite body. The base body may be 3D printed as described previously herein. If additional strength or rigidity is needed, then the composite body in the form of the panel may be used as a core and one or more layers of additional materials, such as but not limited to fiberglass or carbon fiber, may be added to the composite body panel. For a car body or other panels requiring even greater strength, composite materials may be layered within the base body.

For a large sculpture requiring additional strength, a composite body as described previously herein may be backfilled with a rigid foam, cementitious products, or other rigid backfilling materials. For stamping tooling or other tooling, curable resin may be added to the impact side or portion of a base body of sufficient thickness for handling while either applying or not applying resin through a side of the base body opposite the impact side or portion, depending on the strength needed. For two-part stamping tooling, single sided hydroforming tooling, and fiber composite layup tooling, a curable resin may be applied to a base body as described previously herein as a backfill.

In some arrangements, surface treatments may be applied to any such composite bodies, such as for car body or other panels or for tooling requiring such treatments. Once a 3D printed part or other base body is infiltrated, the base body may be coated with a curable resin on an outer surface to be exposed to smooth the surface. Such coating may have fillers such as but not limited to ceramic powder, metal powder, metal fillings including but not limited to metal shavings and filings, plastic powder, and organic powders such as wood flour added to give desired properties. Inner surfaces opposite such outer faces may also or alternatively be coated with a curable resin as well. As described previously herein, these resin-coated surfaces further may be spray metallized with an appropriate metal.

In molding applications, a curable resin or composite may be applied to a 3D printed or other base body of bound particles to form permanent or other reusable molds (e.g., casting mold, roto-mold, etc.) in contrast to a destructible mold in which no strengthening material is generally needed, vacuum-forming, or thermoforming molds.

It is to be further understood that the disclosure set forth herein includes any possible combinations of the particular features set forth above, whether specifically disclosed herein or not. For example, where a particular feature is disclosed in the context of a particular aspect, arrangement, configuration, or embodiment, that feature can also be used, to the extent possible, in combination with and/or in the context of other particular aspects, arrangements, configurations, and embodiments of the technology, and in the technology generally.

Furthermore, although the technology herein has been described with reference to particular features, it is to be understood that these features are merely illustrative of the principles and applications of the present technology. It is therefore to be understood that numerous modifications, including changes in the sizes of the various features described herein, may be made to the illustrative embodiments and that other arrangements may be devised without departing from the spirit and scope of the present technology. In this regard, the present technology encompasses numerous additional features in addition to those specific features set forth in the claims below. Moreover, the foregoing disclosure should be taken by way of illustration rather than by way of limitation as the present technology is defined by the claims set forth below.

The invention claimed is:

1. A 3D printed composite body having integrally formed first and second body portions, comprising:
   a bound mixture including a binder and a plurality of particles;
   unbound particles between the first and second body portions; and
   a resin fully infiltrating the bound mixture such that the resin fully infiltrates an entire thickness of the first body portion,
   wherein at least a portion of the first and second body portions are separated by the unbound particles.

2. The composite body of claim 1, wherein the bound mixture defines pores into which the resin is infiltrated.

3. The composite body of claim 1, further comprising a coating applied to the bound mixture, the coating forming an outer layer of the composite body.

4. The composite body of claim 3, wherein the coating is any one or any combination of a spray metallization, fiber strands, a fiber weave, metal plating, and dry powders.

5. The composite body of claim 1, wherein the binder is one part of a two-part curable resin.

6. The composite body of claim 1, wherein the plurality of particles are made of any one or any combination of a sand, sodium bicarbonate, polymer, plaster, metal, ceramic, ash, and organic powders.

7. The composite body of claim 1, wherein the composite body is in the form of an at least partially hollow shell.

8. The composite body of claim 1, wherein the resin has been applied from a plurality of directions to define a part line.

9. The composite body of claim 1, wherein the bound mixture defines a gradient porosity within the composite body.

10. The composite body of claim 1, wherein a porosity of an interior of the composite body is greater than a porosity of an exterior of the composite body opposite the interior of the composite body.

11. A combination comprising a plurality of composite bodies of claim 1, each of the composite bodies being fused to another of the composite bodies.

12. A combination comprising:
    the composite body of claim 1 defining a core; and
    a shell at least partially surrounding the core.

13. A 3D printed composite body having integrally formed inner and outer portions separated by an edge, comprising:
    a first bound mixture defining the outer portion, the first bound mixture including a binder and a first plurality of particles;
    a second plurality of particles defining the inner portion; and
    a resin fully infiltrating the outer portion to the edge without infiltrating the inner portion such that the resin-infiltrated first bound mixture surrounds and retains the second plurality of particles,
    wherein the outer portion of the composite body is thin relative to an overall thickness of the composite body.

14. The composite body of claim 13, wherein the second plurality of particles are combined with the binder to form a second bound mixture, and wherein the resin-infiltrated first bound mixture surrounds and retains the second bound mixture.

15. A method of forming a 3D printed composite body having integrally formed first and second body portions, comprising the steps of:
    combining a plurality of particles with a binder to form a bound mixture; and
    infiltrating the bound mixture with a resin to a depth such that substantially an entire thickness of the first body portion contains the resin wherein at least a portion of the first and second body portions are separated by unbound particles.

16. The method of claim 15, further comprising the step of removing a portion or portions of the bound mixture such that substantially the entire thickness of the first body portion contains the resin.

17. The method of claim 15, wherein the combining step includes forming the bound mixture around the unbound particles.

18. The method of claim 15, wherein the combining step includes forming the first portion first section defined by unit cells extending from the second body portion.

19. The method of claim 15, further comprising the step of coating the bound mixture infiltrated with the resin.

20. The method of claim 19, wherein the coating surrounds the bound mixture infiltrated with the resin, further comprising the step of removing the unbound particles inside the coating.

21. The method of claim 19, wherein the coating is a metal plating.

22. The method of claim 19, further comprising applying additional dry particles to the bound mixture infiltrated with the resin.

* * * * *